United States Patent

Brown

[11] Patent Number: 6,058,144
[45] Date of Patent: May 2, 2000

[54] MULTI-GB/S DATA PULSE RECEIVER

[75] Inventor: Anthony Kevin Dale Brown, Kanata, Canada

[73] Assignee: Nortel Networks Corporation, Montreal, Canada

[21] Appl. No.: 09/054,440

[22] Filed: Apr. 3, 1998

[51] Int. Cl.[7] .................................................. H04L 27/06
[52] U.S. Cl. ............................................................. 375/316
[58] Field of Search .................................... 375/316, 318, 375/257, 238, 346; 327/65; 330/252

[56] References Cited

U.S. PATENT DOCUMENTS

| | | | |
|---|---|---|---|
| 4,430,580 | 2/1984 | Lovelace | 327/214 |
| 4,599,602 | 7/1986 | Matzuzawa et al. | 341/161 |
| 4,742,309 | 5/1988 | Chu | 327/65 |
| 5,432,486 | 7/1995 | Wong | 333/109 |
| 5,852,637 | 12/1998 | Brown et al. | 375/316 |

FOREIGN PATENT DOCUMENTS 0 415 620 A2  8/1990  European Pat. Off. .......... H03F 3/45

WO 97/221270  6/1997  WIPO .......................... H03K 3/2897

OTHER PUBLICATIONS

"Bus–Driver ICs", Quinnell, R.A., et al, Electrical Design News (EDN), 37, No. 3, Feb. 3, 1992, pp. 78–86.
Gray & Meyer, "Analysis and Design of Analog Integrated Circuits", Wiley, 3$^{rd}$ Edition 1993, p. 497.

*Primary Examiner*—Tesfaldet Bocure
*Attorney, Agent, or Firm*—Dallas F. Smith

[57] ABSTRACT

A data pulse receiver for detecting and amplifying substantially attenuated data pulses received at gigabit-per-second rates from a differential coupler with outputs having asymmetrical dc characteristics. The receiver, in a preferred embodiment, has grounded base differential amplifiers to give impedance matching, a biasing resistor connected to a separate ground terminal for biasing one of the differential amplifiers, and a matching resistor, connected at only one of its terminals, to compensate for the stray capacitance of the biasing resistor. A regenerative flip-flop with programmable tail current provides hysteresis in order to suppress unwanted noise. The receiver may also include means for automatic adjustment of the hysteresis level.

20 Claims, 4 Drawing Sheets

MULTI-GB/S DATA PULSE RECEIVER

FIELD OF THE INVENTION

This invention relates to a data receiver and more particularly to a receiver for detecting and amplifying low level data pulses.

BACKGROUND OF THE INVENTION

With the current emphasis on the Information Highway and the explosion of telecommunications in general, the quantity and speed of data transmission continues to grow. In the telecommunications industry, as well as in computer technology, there exists a need to transmit large quantities of data from point to point, for example between memory and processors in multiple processor computers. The large number of data bits coupled with the large number of connections create an interconnect bottle neck which requires large numbers of data drivers with their associated large amount of electrical power. One technique that is employed to overcome this congestion difficulty is to multiplex large numbers of parallel bit streams up to higher rate serial bit streams, thus reducing the numbers of electrical connections that need to be made. The need for low power multiplex and demultiplex circuits capable of combining data signals at 50 Mb/s up to 1 Gb/s, for example, has attracted considerable interest among commercial integrated circuit vendors. Nevertheless, the computer and communications industries continue to search for lower power solutions.

PRIOR ART

In addition to the aforementioned interconnect bottle neck associated with multi-processor computers, the high data speeds can also lead to the generation of electromagnetic interference (EMI) problems at physical interfaces such as conventional connectors. One technique that has been employed successfully to reduce the number of interconnections and EMI in communications switching equipment involves a contactless backplane. This technique is based on directional coupling principles wherein data transfer occurs between proximate conductors. An example of one such coupling connector is described in U.S. Pat. No. 5,432,486 which issued Jul. 11, 1995 to Wong and assigned to Northern Telecom Limited. The technique can be expanded to permit point-to-multipoint and multipoint-to-point data transmission over a passive backplane without loss of signal integrity due to multipoint connectors. In this method, distribution of the multi gigabit-per-second serial data employs a form of a.c. coupling, of such small proportions, that the data information is contained in the data transitions. Thus a data signal in NRZ format on the transmission path is coupled to the receiver path as positive and negative going pulses. The received data at the demultiplex circuit is considerably attenuated: signal levels of only 70 mV peak-to-peak, or less, are not uncommon.

In a co-pending Patent Application titled "Noise Cancellation Modification to a Non-Contact Bus" by John Williamson et al. and assigned to Northern Telecom Limited, a differential microwave coupler is disclosed that achieves ac coupling of considerably attenuated signals similar to those described above. The coupler provides a cancelling effect of undesirable data pulse reflections caused by vias, connectors, and other sources of controlled impedance discontinuities. This effect is provided by the configuration of the coupler's inputs, one of which is shorted to ground and the other of which is open circuit. The purpose of this open-short configuration of the inputs is to reverse the polarity of the undesirable reflections at one input with respect to the other input thereby translating differential reflections into common mode reflections. A result of this open-short configuration however, is that the outputs of the coupler have mismatched dc characteristics.

In U.S. patent application Ser. No. 08/568,911, Brown discloses a data pulse receiver for detecting and amplifying serial data received from a contactless backplane. Characteristics of the receiver include wide frequency bandwidth, matched input impedance, and hysteresis for discriminating against unwanted noise. Although it appears to be suitable for the purpose for which it was designed, the receiver is not suitable to be used in conjunction with couplers of the type disclosed by Williamson because of dc biasing problems caused by the mismatched dc characteristics of the coupler's outputs.

A receiver suitable for working in conjunction with a coupler of the type disclosed by Williamson should be immune to any dc biasing problems that the coupler may present, as well as provide rejection of common mode reflections that the coupler introduces. Furthermore, in order for the receiver to provide reliable reception of considerably attenuated signals special techniques are required including signal amplification, wide frequency bandwidth, and hysteresis for discriminating against unwanted noise.

The present invention relates to the requirement of detecting serial data from substantially attenuated differential signals of gigabit-per-second rates received from a differential coupler having outputs with mismatched dc characteristics.

SUMMARY OF THE INVENTION

It is an object of the present invention to provide a data pulse receiver to detect and amplify attenuated serial data received from a differential coupler.

Therefore in accordance with the present invention there is provided a data pulse receiver. The receiver comprises a differential grounded base amplifier having a pair of bipolar transistors each of the transistors having a base, a collector and an emitter, the bases being connected to a.c. ground. An input having impedance matching means is connected to the emitter of a first transistor of the pair of bipolar transistors for receiving the data pulse. A biasing resistor is connected from the emitter of the first transistor to ground. A load resistor is connected between the collector of the first transistor and a positive supply. A hysteresis generating means is connected to the collector of the first transistor and has a current supply. An output terminal is connected to the collector of the first transistor for delivering an amplified data pulse output.

In a preferred embodiment the data pulse receiver comprises a differential grounded base amplifier having a pair of bipolar transistors each of the transistors having a base, a collector and an emitter, the bases being connected to a.c. ground. Two inputs for receiving the data pulse, include a first input having impedance matching means connected to the emitter of a first transistor of the pair of bipolar transistors and a second input having impedance matching means connected to the emitter of a second transistor of the pair of bipolar transistors. A biasing resistor is connected from the emitter of the first transistor to ground. Two load resistors include a first load resistor, connected between the collector of the first transistor and a positive supply, and a second load resistor, connected between the collector of the second transistor and a positive supply. A hysteresis generating means is connected to the collectors and has a current supply. Two output terminals for delivering an amplified data pulse output, include a first output terminal connected to the collector of the first transistor, and a second output terminal connected to the collector of the second.

An advantage of the present invention is that it is suitable to be used with a particular coupler, which has asymmetrical dc output characteristics, without requiring dc blocking capacitors on the receiver inputs. The particular coupler has two outputs, one of which is an open circuit and the other is a short circuit to ground. A benefit of the receiver inputs not requiring dc blocking capacitors is that less components are required leading to reduced costs and improved reliability. Furthermore, multiple receivers can be manufactured on one integrated circuit thus providing a higher level of integration leading to a further reduction in costs.

Conveniently, a matching resistor is connected to the emitter of a second transistor of the pair of bipolar transistors and unconnected at its other terminal. An advantage of providing the matching resistor connected in this manner is that it aids in compensating for substrate noise picked up by the parasitic capacitance of the biasing resistor.

Conveniently, when the receiver is constructed as an integrated circuit the biasing resistor can be connected to a ground terminal that is external to the integrated circuit. An advantage of providing an external ground for the biasing resistor, instead of an internal on-chip ground, is a reduction in the effect that noise present at the on-chip ground has on the amplified data pulse output. Furthermore, if the coupler output shorted to ground is connected to the external ground then noise at the external ground appears as common mode noise to the amplifiers and is therefore rejected by the receiver.

BRIEF DESCRIPTION OF THE DRAWINGS

The invention will now be described in greater detail with reference to the attached drawings wherein.

In the drawings like characters of reference indicate corresponding features in the different figures.

DETAILED DESCRIPTION OF THE INVENTION

Figure 1:
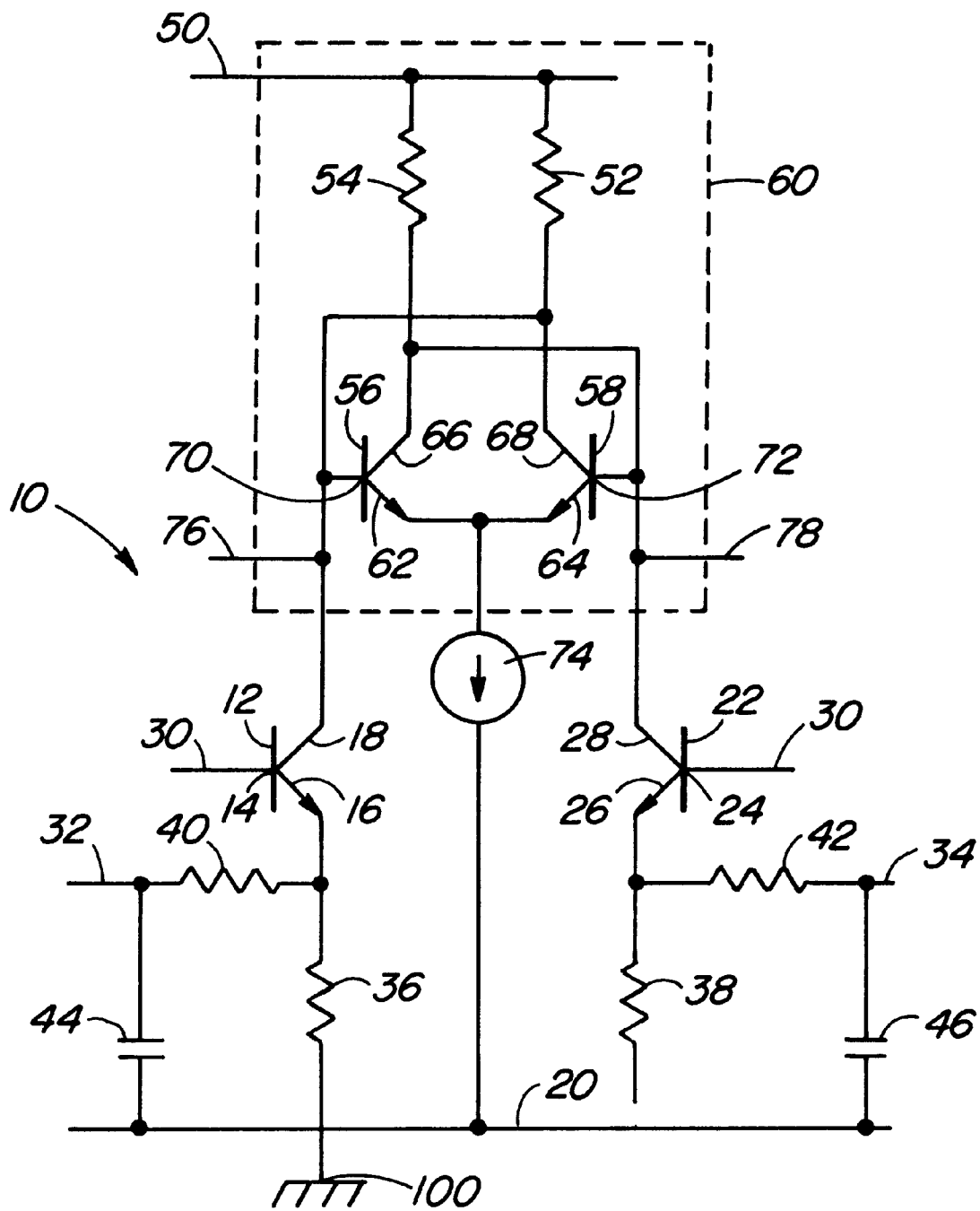
FIG. 1 is a circuit diagram of a preferred embodiment of the present invention.

FIG. 1 is a circuit diagram of a preferred embodiment of the present invention. A receiver 10 includes a grounded base amplifier 12 having a base 14, an emitter 16 and a collector 18, and a grounded base amplifier 22 having a base 24, an emitter 26 and a collector 28. Bases 14 and 24 are connected to an a.c. ground 30 and are typically biased at 1.3 volts dc.

Figure 2:
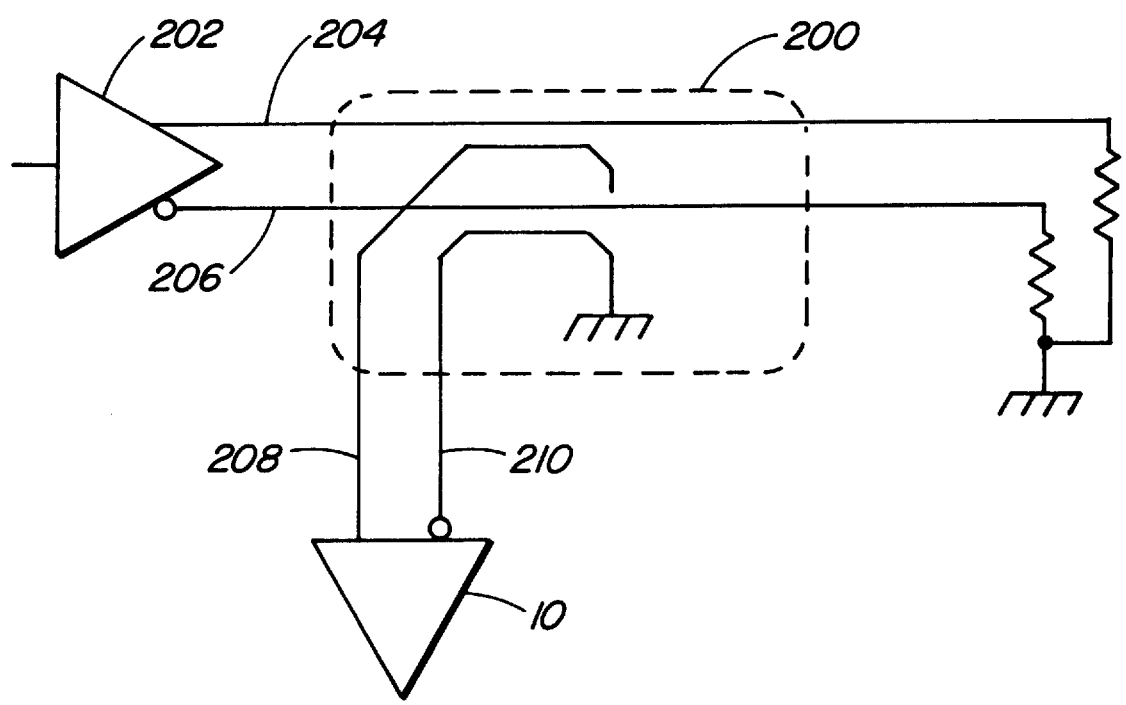
FIG. 2 is a circuit diagram of a Williamson coupler shown connected to the receiver of FIG. 1.

FIG. 2 is a circuit diagram of a Williamson coupler 200 shown connected to the receiver 10 of FIG. 1. A differential data driver 202 transmits differential signals on transmission lines 204 and 206. The coupler 200 detects the differential signals and outputs differential data pulses on an open coupler output 208 and a dc grounded coupler output 210.

Referring again to FIG. 1, a dc open input 32 is connected to the emitter 16 of the amplifier 12 through an impedance matching resistor 40. An impedance matching resistor 42 connects a dc grounded input 34 to the emitter 26 of the amplifier 22. Differential data pulses are supplied to inputs 32 and 34 from coupler outputs 208 and 210, respectively. A dc biasing resistor 36 is connected between the emitter 16 and an external ground 100. A matching resistor 38, connected at one terminal to the emitter 26 and unconnected at the other terminal, compensates for on-chip substrate noise picked up by the parasitic capacitance of the dc biasing resistor 36. Capacitors 44 and 46 represent stray capacitance inherent in the structure.

Collectors 18 and 28 are connected to a positive source 50 through load resistors 52 and 54 respectively. Load resistors 52 and 54 in combination with bipolar transistors 56 and 58 form a regenerating flip-flop 60. The regenerating flip-flop 60 reconverts a Return-to-Zero (RZ) pulse signal to a Non-Return-to-Zero (NRZ) format output signal. Transistors 56 and 58 include commonly connected emitters 62 and 64, collectors 66 and 68, and bases 70, 72. The commonly connected emitters 62, 64 are provided with a tail current by a current source 74 that has a return path to an internal on-chip ground 20. The output signal in NRZ format is provided at complementary output terminals 76 and 78.

The impedance matching resistor 42 provides a dc current path to ground for the amplifier 22 when the input 34 is connected to the dc grounded coupler output 210. DC current flowing through this path provides biasing of the amplifier 22. A typical value of 100 ohms for the impedance matching resistor 42 results in a dc bias current in the order of 4 mA when the base 24 is connected to 1.3 volts dc.

The dc biasing resistor 36 provides a dc current path to the external ground 100 for the amplifier 12. A typical value of 100 ohms for the dc biasing resistor 36 results in a dc bias current in the order of 4 mA when the base 16 is connected to 1.3 volts dc. The dc biasing resistor 36 does not cause significant imbalance to the ac characteristics of the grounded base amplifiers 12 and 22 because it is connected in parallel with the emitter impedance of the grounded base amplifier 12, which is in the order of 5 ohms. This impedance is dependent upon the dc biasing current of the grounded base amplifier 12.

Resistors 36 and 42 provide symmetrical dc biasing current for the grounded base amplifiers 12 and 22, respectively, when the asymmetrical coupler outputs 208 and 210 are connected to their respective inputs.

In order to minimise the effect of internal noise, which is present at the internal on-chip ground 20, the return path for the dc biasing current of amplifier 12 is provided by the external ground 100. Consequently, when the coupler output shorted to ground is connected to the external ground noise at the external ground appears as common mode noise to the amplifiers and is therefore rejected by the receiver 10. The return path to the external ground 100 provides an order of magnitude reduction in the amount of timing jitter of the NRZ output signal compared to a return path to internal on-chip ground 20.

The matching resistor 38 compensates for the substrate noise picked up by the parasitic capacitance of the dc biasing resistor 36. One terminal of the matching resistor 38 is connected to the emitter 26 and the other terminal is left unconnected. As a result, substrate noise that is coupled by the parasitic capacitance of resistors 36 and 38 appears as common mode noise and is therefore rejected.

Figure 3:
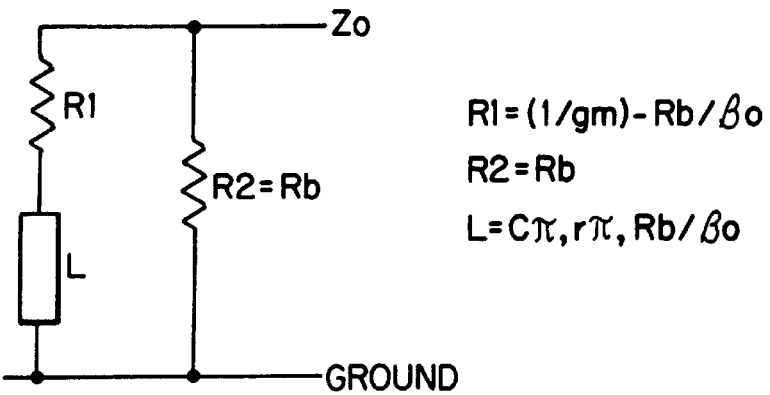
FIG. 3 is an equivalent circuit for emitter input impedance.
Figure 4:
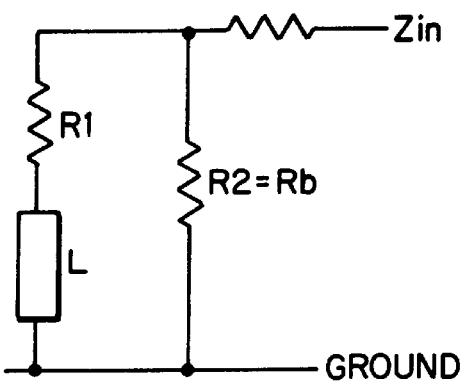
FIG. 4 is an equivalent circuit for grounded base amplifier input impedance.

The receiver 10 has the largest possible bandwidth due to the use of the grounded base amplifiers 12 and 22. The effect of parasitic capacitance 44,46 on the input terminals 32,34, which would normally shunt the input signal, is compensated by an inductance seen at the emitters 16, 26 of the grounded base amplifiers 12, 22. This effect significantly extends the frequency response of the amplifiers 12,22. Design of the grounded base amplifier is as follows:

According to Gray & Meyer, "Analysis and Design of Analog Integrated Circuits", Wiley, 3rd Edition 1993, page 497: the input impedance of a grounded base amplifier (equivalent to that of an emitter follower), has an equivalent circuit as shown in FIG. 3. Taking into consideration the impedance matching resistance 40, 42 and resistors 36, 38 of FIG. 1, the grounded base input impedance equivalent circuit is shown in FIG. 4. Bearing in mind that this input impedance will vary depending upon the amplitude of the input signal and the desirability of attaining an input impedance of approximately 50 ohms over the full range of the input pulse amplitude, this dictates the nominal emitter current required in the grounded base amplifier.

For example:

Suppose the maximum pulse level is 120 mV (single ended) and the minimum pulse level is 70 mV.

Then the maximum current pulse expected in a 50 ohm termination is 2.4 mA, and according to Kirchoff's Law, most of this current will pass through the grounded base amplifier emitter/collector circuit.

One can calculate the percentage mismatch error of the 50 ohm input impedance from:

$$\text{Error}(\%)=100*0.019*((1/(\text{Ie}-(\text{Vp}/50)))-(1/\text{Ie}))/50$$

where Ie is the emitter bias current and Vp is the pulse amplitude.

The transistors of the grounded base amplifiers 12,22 will in general be quite large, in order to withstand electrostatic discharge potentials. Normally this protection will be augmented by means of parallel diodes (not shown). As a result, due to the size of the transistors, the effect of parasitic emitter and base resistance has been neglected since these will be quite small. The above results have been plotted in FIG. 5, showing the variation of impedance mismatch for various signal levels against the amplifier bias current.

Figure 5:
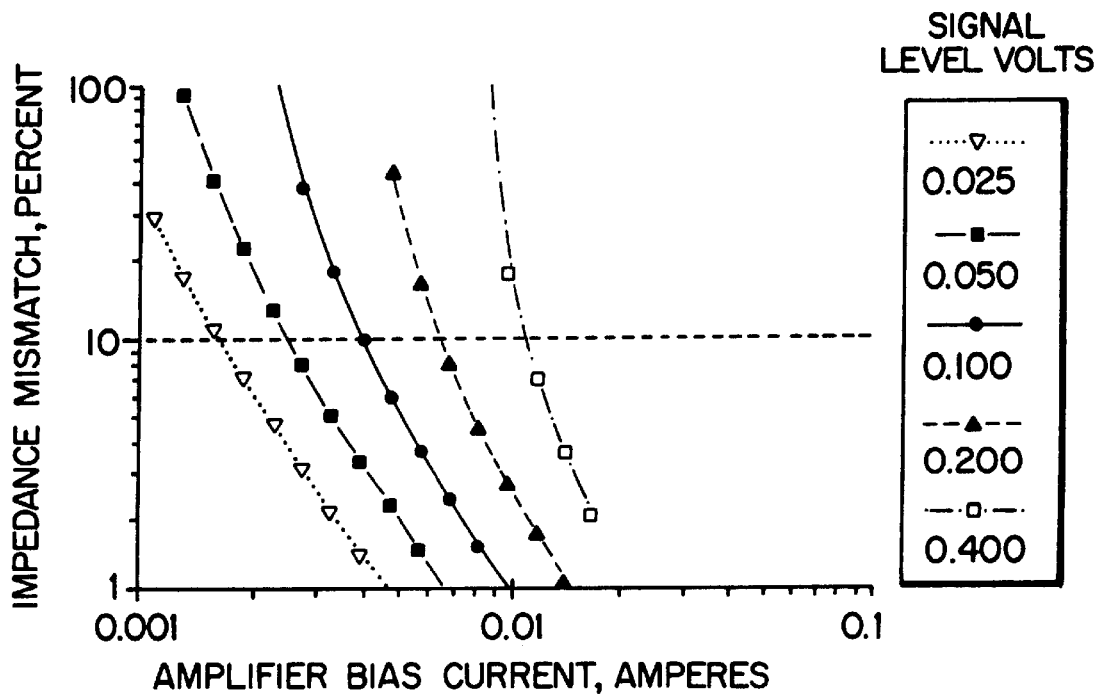
FIG. 5 shows the variation of 50 ohm termination impedance as a function of signal level and bias current.

For example:

Referring to FIG. 5, to match the input impedance between 40 to 60 under maximum signal conditions would require a total power supply current of 5 mA (or a power of 15 mW at 3 volt power supply).

Under these last conditions, one can show (from Grey & Meyer) that a typical input inductance of about 0.5 nH would be obtained for typical medium size (0.8×40 micron emitters) transistors in a 10 GHz $f_T$ bipolar process and this would help to compensate parasitic capacitances of several picofarad magnitude at 1 or 2 Gb/s data rates.

As discussed previously, the grounded base amplifiers 12, 22 are connected to the set-reset flip-flop 60. The magnitude of the tail current of the flip-flop 60 can be adjusted by the current supply 74 to obtain a controlled amount of hysteresis. In practice, the tail current is adjusted to an amount specified for detection of a particular input signal current. This input current passes through the collector load resistors 52,54 of the flip-flop 60. At the same time, the tail current of the flip-flop 60 passes through the same collector load resistors 52,54. Therefore, to change the state of the flip-flop 60, the voltage produced by the input current in the collector resistors 52,54 must exceed the voltage established by the tail current in the same resistors 52,54.

The tail current in the flip-flop 60 can be easily adjusted by means of an external resistor or wired connection, to suit a particular application. If the input signal is differential then the contribution of the input signal currents from both inputs 32,34 must be taken into account. However, if the input signal is only applied to one input of the receiver 10, the tail current must be halved for the same amount of hysteresis. In most circumstances the input signal will be differential to take advantage of the substantial immunity to common mode input noise of the receiver 10. It should also be noted that according to standard communications theory the input noise level relative to the hysteresis level must be of the order of −24 dB to obtain a transmission bit error rate of one error in $10^{-14}$.

For example:

For an input pulse level of 50 mV peak, a pulse current of 1 mA is transported by both grounded base amplifier 12,22 emitter collector circuits, and therefore the tail current level of the flip-flop 60 must be 2 mA.

Figure 6:
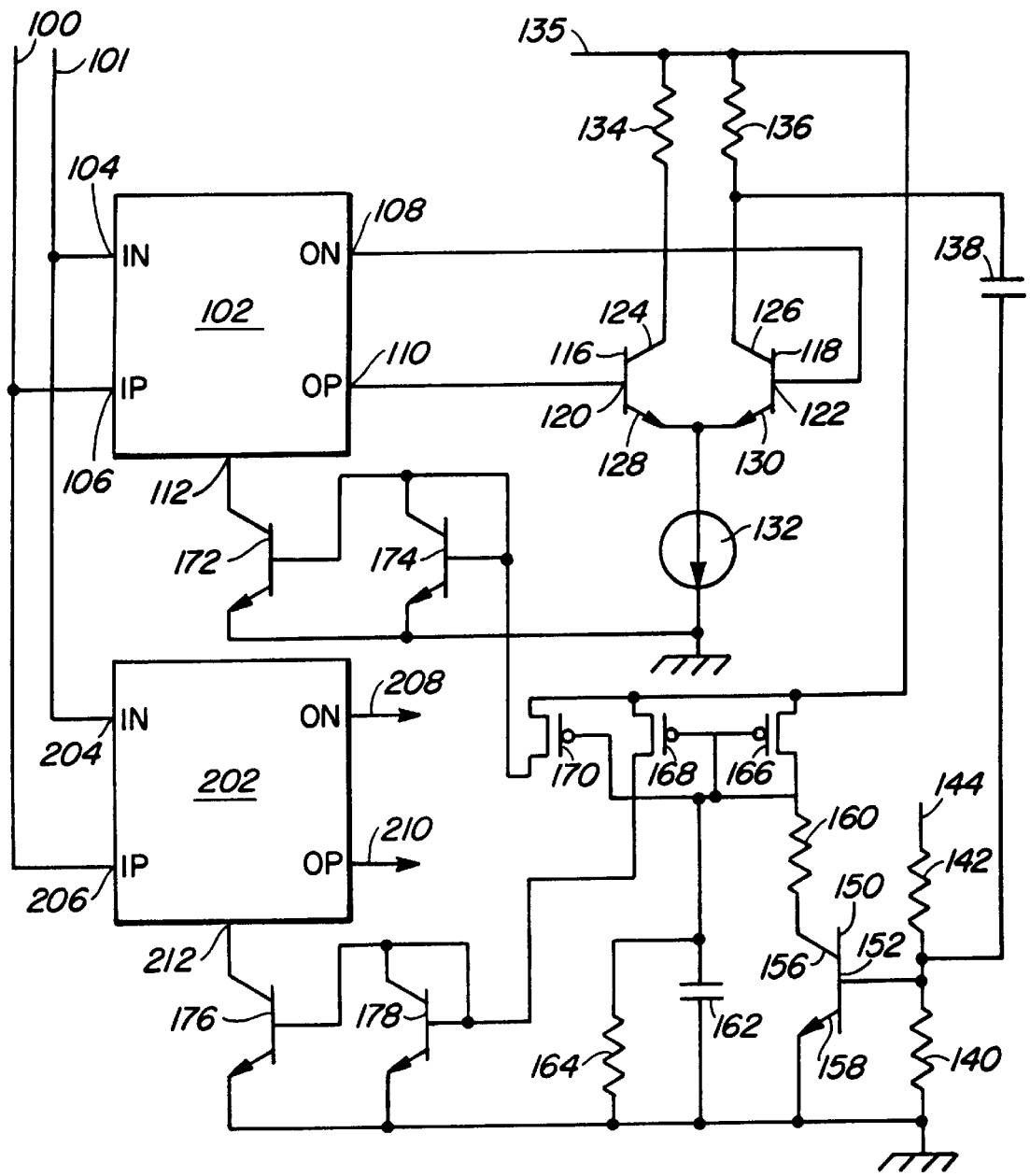
FIG. 6 is a circuit diagram of a data pulse receiver with automatic hysteresis adjustment.

FIG. 6 represents a particular application of the signal data receiver of the present invention. In this application the level of the input signal or data at line 102 and 104 is either not known or is variable. Under these conditions a fixed hysteresis level is undesirable since an optimum bit error rate cannot generally be obtained. To overcome this difficulty it is desirable to monitor the level of the incoming data signal and to adjust the hysteresis level by automatic means.

A target specification for the receiver 10 is that it should be able to detect incoming data pulses having a peak amplitude of 30 mV and pulse duration exceeding the hysteresis level of not less than 200 ps. The energy present in such data pulses is so small that monitoring the level accurately presents some difficulty. In this regard, recall that the data pulses are converted immediately from RZ (return to zero) format to NRZ format (non-return to zero) by the receiver 10. Direct monitoring of the amplitude of the input data stream has in fact not been possible. However, an alternative scheme has been employed which successfully monitors the input pulse height very accurately and enables optimum adjustment of the hysteresis level.

The pulse height at the outputs 76,78 of the receiver 10 is primarily determined by the level of the hysteresis bias current of the flip-flop 60. The flip-flop 60 will toggle, thereby changing the state of the outputs 76 and 78, provided that the input data signal magnitude exceeds the hysteresis level by an unknown amount. If the outputs 76,78 are connected to a differential pair, then the output of the differential pair will also toggle, if the flip-flop 60 toggles. Further, common mode variations at the outputs 76,78 will not be present at the output of the differential pair. Thus the presence or absence of pulses at the output of the differential pair can be taken to indicate that the hysteresis level is either less than or greater than the differential magnitude of the incoming data pulse.

By a.c. coupling the output of the differential pair to a rectifier circuit one obtains a signal whose magnitude is either large, or very small, depending on whether the hysteresis level is less than or greater than the incoming data pulse peak magnitude. In addition, by integrating the output of the rectifier circuit, a voltage is obtained which can be used to adjust the level of the hysteresis bias current. The net result is an automatic hysteresis adjustment which continually adjusts the data pulse receiver 10 hysteresis level to the level of the data pulses.

However, it will be immediately clear that the adjustment of the hysteresis level to the peak magnitude of the data pulses will result in unreliable reception of the data. It will be unreliable because even a slight reduction in the magnitude of a data pulse could result in it not being detected. Utilizing a second data pulse receiver in parallel with the first provides a solution to this problem. The first receiver monitors the data pulse magnitude while the second receiver has its hysteresis level set to value proportionally lower than that of the first receiver. In fact, it is possible to set the hysteresis level of the second receiver to be any desired proportion of the peak height of the data pulse. A level of 50% usually results in optimum bit error rate performance. Of course, when two data pulse receivers are connected in parallel, their individual input impedance are adjusted to provide a proper combined input termination impedance.

FIG. 6 illustrates schematically a data pulse receiver with automatic hysteresis adjustment. In FIG. 6, the data pulses are transferred to the receiver via lines 100,101. The receiver 10 illustrated in FIG. 1 is box 102 in FIG. 6. The differential pulse input is supplied at input terminals 104 and 106. The receiver output is taken from terminals 108 and 110 while the current sink for this receiver is supplied at terminal 112. The receiver 102 is used to monitor the data level. A second receiver 202, of the same type as receiver 10 illustrated in FIG. 1, having inputs 204,206, outputs 208,210 and automatically adjusted hysteresis tail current supplied at terminal 212, is used to receive the data with very low bit-error-rate.

It is to be assumed that the transistors 116, 118, 172, 174, 176 and 178 are all the same size. The P-channel field effect transistors 166,168 and 170 have different sizes: in particular the ratio of the transconductance of transistors 170 and 168 determines the ratio of the current sink from the receivers 102 and 202 respectively. The transistor pairs 172,174 and 176,178 are 1:1 mirrors used for mirroring the current sourced by transistors 170 and 168 respectively. If the transconductance of the transistor 166 is less than that of the transistor 168 then the P-channel FET mirror of the transistors 166,168 will exhibit current gain. This current gain increases the accuracy of pulse height detection which is an advantage. In a particular embodiment of the invention the transistors 166,168 and 170 have equal channel lengths and their channel widths are in the ratio 1:5:10 respectively. In this arrangement the hysteresis level of the receiver 202 will be set to half of the data peak amplitude.

The differential output of the receiver 102 is supplied to a differential pair of transistors 116,118 at their respective bases 120,122. The transistors 116,118 have respective emitters 128,130 connected to a current source 132 for providing bias current thereto. The transistors 116,118 have respective collectors 124,126 connected to a positive supply 135 via two respective load resistors 134,136. The transistors 116, 118 will switch if the output of the pulse receiver 102 switches. This will occur if the data pulse peak magnitude is greater than the hysteresis level of the pulse receiver 102. An output of the differential pair of transistors 116,118 is taken from the load resistor 136 and is a.c. coupled via a capacitor 138 to a detector circuit comprising two resistors 140,142 and a transistor 150. In a practical circuit one might also utilize the output from the load resistor 134 with an additional parallel connected detector circuit, thereby increasing the sensitivity of the circuit. The second detector circuit is not shown in FIG. 6 for the sake of simplicity.

The detection circuit comprising the resistors 140,142 and the transistor 150 is biased by means of a reference voltage 144. The ratio of the resistors 140,142 is selected so that the voltage at the base 152 is just less than a diode voltage drop, say about 0.75 volts. When pulses are coupled via the capacitor 138 to the base 152 of the transistor 150, they momentarily increase the potential on the base 152 and thereby cause the transistor 150 to conduct current which a reduction in the gate potential of the FET 166. The capacitor 162 in conjunction with the resistor 160 is used to integrate the pulsed current from the transistor 150, so that the transistors 166,168 and 170 conduct a slowly varying current. The minimum value of the current in these transistors is set by the resistor 164, thereby establishing a minimum level of hysteresis. This is useful in the case of the absence of input data because it helps to prevent "chattering" of the output due to noise pulses. In a particular example of this circuit in which the data rate was 1.25 Gb/s, the time constant of the resistor 160 and the capacitor 162 was set to about 20 ns.

It is to be understood that the foregoing description and drawings attached hereto relate only to preferred embodiments of the invention. Numerous alterations or variations may be devised by one skilled in the art without departing from the spirit and scope of the invention. The invention is therefore limited only by the definition thereof in the appended claims.

What is claimed is:

1. A data pulse receiver comprising:
   a differential grounded base amplifier having a pair of bipolar transistors each of the transistors having a base, a collector and an emitter, said bases being connected to a.c. ground;
   an input having impedance matching means connected to the emitter of a first transistor of the pair of bipolar transistors for receiving said data pulse;
   a biasing resistor connected from the emitter of the first transistor to ground;
   a load resistor connected between the collector of the first transistor and a positive supply;
   hysteresis generating means connected to the collector of the first transistor and having a current supply; and
   an output terminal connected to the collector of the first transistor for delivering an amplified data pulse output.

2. A data pulse receiver as defined in claim 1, having a matching resistor connected at one terminal to the emitter of a second transistor of said pair of bipolar transistors and unconnected at its other terminal.

3. A data pulse receiver as defined in claim 2, wherein the matching resistor has a substantially equal amount of stray capacitance as said biasing resistor.

4. A data pulse receiver as defined in claim 1, wherein the receiver is constructed as an integrated circuit.

5. A data pulse receiver as defined in claim 4, wherein the biasing resistor connects to a ground terminal that is external to the integrated circuit.

6. A data pulse receiver as defined in claim 1, said data pulse having a peak amplitude of at least 30 mV and a pulse duration of at least 200 ps.

7. A data pulse receiver as defined in claim 1, said hysteresis generating means comprising a regenerative flip-flop for converting a return to zero pulse waveform into a non-return to zero data waveform.

8. A data pulse receiver as defined in claim 1, said current supply for said hysteresis generating means being programmable so as to selectively suppress input signal noise.

9. A data pulse receiver as defined in claim 1, having automatic hysteresis adjustment means.

10. A first data pulse receiver as defined in claim 9, in combination with a second data pulse receiver connected so as to receive said input data pulse in parallel with the first pulse receiver, said second data pulse receiver being provided with a hysteresis bias current, the level of which is a preset ratio of the hysteresis bias current provided to the first pulse receiver.

11. A data pulse receiver comprising:
- a differential grounded base amplifier having a pair of bipolar transistors each of the transistors having a base, a collector and an emitter, said bases being connected to a.c. ground;
- two inputs for receiving said data pulse, including a first input having impedance matching means connected to the emitter of a first transistor of the pair of bipolar transistors, and a second input having impedance matching means connected to the emitter of a second transistor of the pair of bipolar transistors;
- a biasing resistor connected from the emitter of the first transistor to ground;
- two load resistors including a first load resistor connected between the collector of the first transistor and a positive supply, and a second load resistor connected between the collector of the second transistor and a positive supply;
- hysteresis generating means connected to said collectors and having a current supply; and
- two output terminals for delivering an amplified data pulse output including a first output terminal connected to the collector of the first transistor, and a second output terminal connected to the collector of the second transistor.

12. A data pulse receiver as defined in claim 11, having a matching resistor connected at one terminal to the emitter of the second transistor and unconnected at its other terminal.

13. A data pulse receiver as defined in claim 12, wherein the matching resistor has a substantially equal amount of stray capacitance as said biasing resistor.

14. A data pulse receiver as defined in claim 11, wherein the receiver is constructed as an integrated circuit.

15. A data pulse receiver as defined in claim 14, wherein the biasing resistor connects to a ground terminal that is external to the integrated circuit.

16. A data pulse receiver as defined in claim 11, said data pulse having a peak amplitude of at least 30 mV and a pulse duration of at least 200 ps.

17. A data pulse receiver as defined in claim 11, said hysteresis generating means comprising a regenerative flip-flop for converting a return to zero pulse waveform into a non-return to zero data waveform.

18. A data pulse receiver as defined in claim 11, said current supply for said hysteresis generating means being programmable so as to selectively suppress input signal noise.

19. A data pulse receiver as defined in claim 11, having automatic hysteresis adjustment means.

20. A first data pulse receiver as defined in claim 19, in combination with a second data pulse receiver connected so as to receive said input data pulse in parallel with the first data pulse receiver, said second data pulse receiver being provided with a hysteresis bias current, the level of which is a preset ratio of the hysteresis bias current provided to the first data pulse receiver.

* * * * *